US006553044B1

(12) United States Patent
Eden (10) Patent No.: US 6,553,044 B1
(45) Date of Patent: Apr. 22, 2003

(54) METHOD AND APPARATUS FOR REDUCING ELECTRICAL AND THERMAL CROSSTALK OF A LASER ARRAY

(75) Inventor: Richard C. Eden, Briarcliff, TX (US)

(73) Assignee: Quantum Devices, Inc., Yorba Linda, CA (US)

( * ) Notice: Subject to any disclaimer, the term of this patent is extended or adjusted under 35 U.S.C. 154(b) by 0 days.

(21) Appl. No.: 09/175,235

(22) Filed: Oct. 20, 1998

(51) Int. Cl.[7] .................................................. H01S 3/00
(52) U.S. Cl. ........................ 372/38.02; 372/50; 372/34
(58) Field of Search ............................. 372/50, 23, 34, 372/35, 38.02; 359/7, 130; 438/23, 28, 34

(56) References Cited

U.S. PATENT DOCUMENTS

| | | | |
|---|---|---|---|
| 4,922,480 A | 5/1990 | Bosch | 359/133 |
| 5,404,367 A | 4/1995 | AuYeung et al. | 372/33 |
| 5,467,363 A | 11/1995 | Okabayashi | 372/38 |
| 5,497,391 A | 3/1996 | Paoli | 372/50 |
| 5,513,200 A | 4/1996 | Paoli | 372/50 |
| 5,515,391 A | 5/1996 | Endriz | 372/34 |
| 5,608,747 A | 3/1997 | Baek et al. | 372/33 |

FOREIGN PATENT DOCUMENTS

| | | |
|---|---|---|
| JP | 05-082907 A | 4/1993 |
| JP | 05-251820 A | 9/1993 |
| JP | 08-181380 A | 7/1996 |

OTHER PUBLICATIONS

Thom, E.M. et al., "Low cost, integrated 4–element laser arrays with passive fibre alignment for optical data communications links," *Electronics Letters*, vol. 33(18), pp. 1551–1552 (Aug. 28, 1997).

*Primary Examiner*—Quyen Leung
(74) *Attorney, Agent, or Firm*—Townsend and Townsend and Crew LLP (57) ABSTRACT

Active compensation techniques are used for control of temperature, wavelength, and other characteristics of lasers within a laser array. The laser array includes a plurality of lasers and a plurality of dissipation elements. The dissipation elements can be interstitial to the lasers and can be implemented as non-lasing diodes. The dissipation elements are selectively activated (i.e., turned "on" to dissipate power) to adjust the temperature at the laser junctions. The change in junction temperature allows the lasers to operate at their specified wavelengths. The dissipation elements can be individually controlled and two or more bits of resolution can be provided. Active compensation can be used to adjust (i.e., to compensate) the temperature of selected lasers when one or more lasers are deselected. Active compensation can also be used to adjust (i.e., "tweak") the wavelengths of the lasers within the laser array to be within their specified wavelengths.

17 Claims, 10 Drawing Sheets

METHOD AND APPARATUS FOR REDUCING ELECTRICAL AND THERMAL CROSSTALK OF A LASER ARRAY

BACKGROUND OF THE INVENTION

This invention relates to lasers, and in particular to a method and apparatus for providing active compensation for a semiconductor laser array. Active compensation can be used for control of temperature, wavelength, and other characteristics of each individual laser within the laser array.

Optical communications systems are used to provide high-speed communication, including voice and data services. Conventionally, only one optical signal at one wavelength (or one channel) is transmitted per optical fiber. While demand for bandwidth soars, this one optical wavelength per optical fiber design has limited the capacity of optical communications systems.

Wavelength division multiplexing (WDM) is a technology that greatly increases the information transmission capacity of optical fibers in communications systems. In a WDM system, a multiplicity of independently modulated lasers, each with a unique but precisely controlled wavelength, generate the combined optical signal that is transmitted on the optical fiber. Since multiple lasers are used to drive each fiber, it is desirable for both economic and packaging reasons to use an array of WDM lasers (i.e., one that is fabricated on a single substrate) instead of individually fabricated and packaged devices. Unfortunately, several problems can render the use of simultaneously driven WDM laser arrays impractical.

One problem with conventional WDM laser arrays is the shift in laser wavelengths caused by changes in temperature at the laser sites when one or more particular lasers are turned "on" (i.e., selected for use) or "off" (i.e., deselected). This change in temperature is generally not caused by the bit pattern of the data used to modulate the laser. Typically, the data bit rate is high and results in an average duty cycle of approximately fifty percent and a steady-state power dissipation of approximately one half peak power. The modulating data have negligible effects on the laser temperature.

The problematic temperature change generally occurs when one or more lasers is "deselected" (i.e., the data stream input to the laser is removed). This deselection changes the steady-state power of the deselected laser to a small, or approximately zero, value. Specifically, the problem arises because the operating wavelength of semiconductor lasers is dependent on temperature. For WDM lasers, the operating wavelengths are usually specified to within a narrow range and it is typically necessary to control their operating junction temperatures to within a small temperature range (e.g., $\Delta T \leq 0.1°$ C.) in order to insure operation within the allowable wavelength range. Unfortunately, because of the substantial power levels at which WDM lasers typically operate (e.g., $P_L=0.2$ to 0.5 watts per laser), when one or more lasers in the array are deselected, the thermal crosstalk between these devices in practical array packaging configurations leads to temperature changes much greater than the allowable temperature range. This problem makes it extremely difficult to use laser arrays in applications (e.g., WDM) involving simultaneous and selectable operation of lasers in the array. In fact, for many applications, this problem can preclude the use of laser arrays altogether.

Another problem with conventional WDM laser arrays relates to manufacturing yields. As described above, each laser in the WDM laser array is operated within a narrow wavelength range. For individually packaged lasers, the tight wavelength specifications can be addressed by incorporating a thermoelectric (TE) cooler and temperature controller (or TE cooler/controller) that can be used to adjust the temperature of the laser to obtain the specified operating wavelength. However, with an array of lasers sharing only one TE cooler/controller, the temperature of each of the lasers cannot be independently adjusted to obtain the specified operating wavelengths for all lasers. The probability that the wavelengths of all lasers in the array can be adjusted to be within their wavelength specifications at a particular common temperature controller setting is drastically reduced in comparison to the independently temperature compensated laser. This translates to poor manufacturing yields and increased costs for WDM laser arrays, as compared to individually packaged devices. The poor manufacturing yields make the use of laser arrays prohibitively expensive.

For the foregoing reasons, techniques that provide temperature or wavelength compensation for a semiconductor laser array are highly desirable.

SUMMARY OF THE INVENTION

The invention provides techniques for active compensation for a semiconductor laser array. Active compensation can be used for control of temperature, wavelength, and other characteristics of the lasers within the laser array. Through active compensation, operating performance and manufacturer yields can be improved.

A laser array according to the invention includes a plurality of lasers and a plurality of dissipation elements. In one embodiment, the dissipation elements are interstitial to the lasers (i.e., located between the lasers and at both ends of the laser array). In one embodiment, the dissipation elements are implemented as non-lasing diodes. The dissipation elements are selectively activated (i.e., turned "on" to dissipate power) to maintain the required temperature at the laser junctions. This allows the lasers to operate at their specified wavelengths. The dissipation elements can be individually controlled and two or more bits of resolution for the control can be provided.

In one application, active compensation is used to adjust (i.e., to compensate) the temperature of selected lasers (i.e., lasers that are turned "on") when one or more lasers are deselected (i.e., turned "off"). In another application, active compensation is used to adjust (i.e., "tweak") the wavelengths of the lasers within the laser array to be within their wavelength specifications. Active compensation can be performed dynamically during operation of the laser array.

One specific embodiment provides a semiconductor laser array having active compensation. The laser array includes a plurality of lasers fabricated on a semiconductor substrate and a plurality of dissipation elements located within the laser array. At least one of the dissipation elements has independent control (i.e., independent from a package cooler).

Another specific embodiment provides a compensation circuit for maintaining an operating characteristic of lasers within a laser array. The laser array includes a plurality of lasers and a plurality of dissipation elements. The compensation circuit includes a table to store compensation values and drive circuits coupled to the table. The drive circuits receive the compensation values and generate drive signals for the dissipation elements.

Another specific embodiment provides a laser transmitter having active compensation. The laser transmitter includes a laser array and a compensation circuit. The laser array includes a plurality of lasers fabricated on a semiconductor substrate and a plurality of dissipation elements located within the laser array. At least one of the dissipation elements has independent control. The compensation circuit couples to the laser array and includes a table to store compensation values and drive circuits. The drive circuits couple to the table to receive the compensation values and generate drive signals for the dissipation elements.

Another specific embodiment provides a method for maintaining an operating characteristic of lasers within a laser array. The method includes determining an operating state of each laser in the laser array, selecting compensation values from a table corresponding to the determined operating state of the laser array, generating drive signals in accordance with the compensation values, and providing the drive signals to selective ones of the dissipation elements within the laser array.

Yet another specific embodiment provides a method for adjusting operating wavelengths of lasers within a laser array. The method includes determining the operating wavelengths of the lasers under an initial operating conditions, computing wavelength errors based on the determined operating wavelengths and the specified wavelengths, determining compensation values that reduce the wavelength errors, generating drive signals in accordance with the compensation values, and providing the drive signals to selective ones of the dissipation elements within the laser array.

The foregoing, together with other aspects of this invention, will become more apparent when referring to the following specification, claims, and accompanying drawings.

DESCRIPTION OF SPECIFIC EMBODIMENTS

Laser Array

Figure 1A:
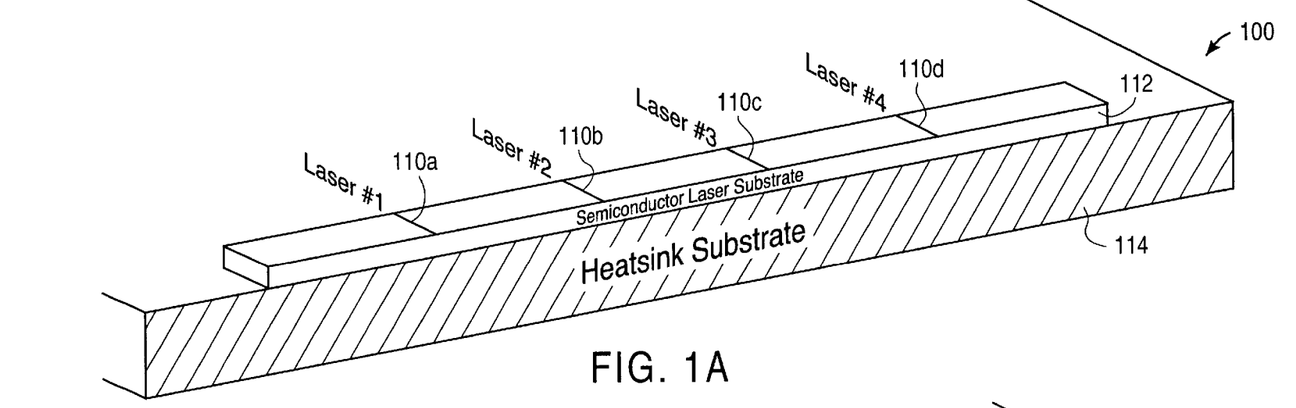
FIGS. 1A and 1B are diagrams of a conventional laser array and a laser array of the invention, respectively.

FIG. 1A is a diagram of a conventional laser array 100. As shown in FIG. 1A, laser array 100 includes four lasers 110a through 110d. The four-laser array ($N_L$=4) is shown by way of example. Other laser arrays can include more or fewer lasers. Each laser 110 is a narrow multi-layer diode strip (e.g., typically a few microns in width) formed in the top few microns of a semiconductor laser substrate 112 that is, for example, approximately 100 microns in thickness. Laser substrate 112 sits on top of a heat sink substrate 114. Semiconductor laser substrate 112 is also referred to as a laser array bar. Lasers 110 are typically equally spaced apart (e.g., by approximately 0.25, 0.50, 0.75, or 1.0 mm).

Figure 1B:
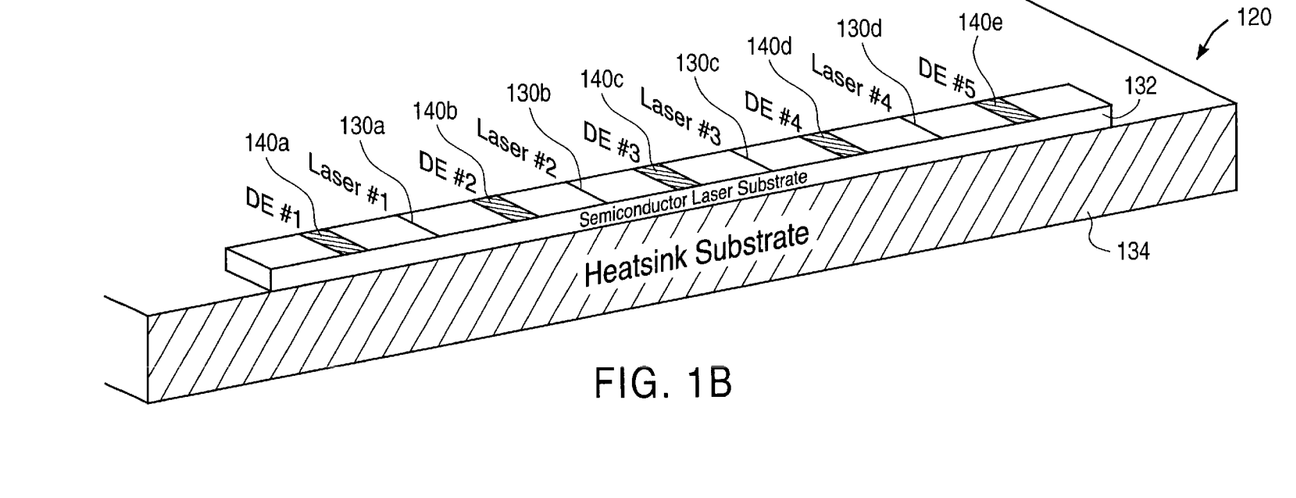

FIG. 1B is a diagram of a laser array 120 of the invention. As shown in FIG. 1B, laser array 120 also includes four lasers 130a through 130d that are dimensioned and evenly spaced similar to those in laser array 100. However, laser array 120 further includes five "dummy" dissipation elements 140a through 140e that are located between lasers 130 and at both ends of laser array 120. Again, the four lasers ($N_L$=4) and five dissipation elements ($N_D$=5) within laser array 120 are shown by way of example. Other laser arrays can include more or fewer lasers 130 and more or fewer dissipation elements 140. Dissipation elements 140 function to create precise and controlled power dissipation levels in specific regions of laser array bar 132.

FIG. 1B shows the addition of interstitial dissipation elements 140 between lasers 130, as well as on both ends of laser array 120, to provide the required temperature compensation. In one embodiment, there is at least one dissipation element 140 between a pair of lasers 130 plus one dissipation element 140 on each end of laser array 120. Dissipation elements 140 can be equidistant between pairs of lasers 130, and at a similar distance from the end lasers 130a and 130d. This configuration reduces the number of required dissipation elements 140, while providing the necessary thermal coupling coefficients to lasers 130, This configuration also provides more space for contact pads to laser array 120. However, the number and location of dissipation elements 140 are flexible. For example, dissipation elements 140 can be placed closer to lasers 130.

Dissipation elements 140 can be implemented in various ways. In a preferred embodiment, dissipation elements 140 are implemented as non-lasing diodes. This embodiment provides several advantages in implementing the control system for driving dissipation elements 140 and in the calibration of laser array 120. First, non-lasing diodes can be easily fabricated on laser array bar 132 because the epitaxial layer structure (i.e., the bar) on the semiconductor substrate is already designed for easy fabrication of diodes (e.g., lasers 130). Thus, the extra dissipation diodes can be incorporated into the process with minimal additional costs. Further, the forward voltage drop of the dissipation diodes tends to track that of lasers 130. This property allows tracking of the drive-current-to-power conversion factors for the dissipation diodes and lasers 130 over variations in processing and temperature.

Dissipation elements 140 are designed to provide predictable thermal dissipation over a wide range of power levels (from low dissipation power to high dissipation power). Lasing diodes tend to show some erratic behaviors of their current-voltage (I-V) curves near the lasing threshold. For the embodiment wherein dissipation elements 140 are implemented as non-lasing diodes, the erratic I-V behaviors can be reduced by suppressing the tendency of the dissipation diodes to lase. This can be accomplished by various techniques such as: (1) making the dissipation diodes wider (as shown in FIG. 1B), (2) giving the dissipation diodes a curved or a "zigzag" pattern wherein the stripe is not perpendicular to the cleaved facet faces, or a combination of these and other techniques.

Besides non-lasing diodes, other types of dissipation elements can also be used and are within the scope of the present invention. For example, surface metal strips, resistors, or lasing diodes can be used. However, resistors can have different dependencies on temperature and manufacturing parameter variations than diode devices. Also, lasing diodes can produce high levels of stray laser light inside the package that could potentially cause problems.

Thermal Modeling

Figure 2A:
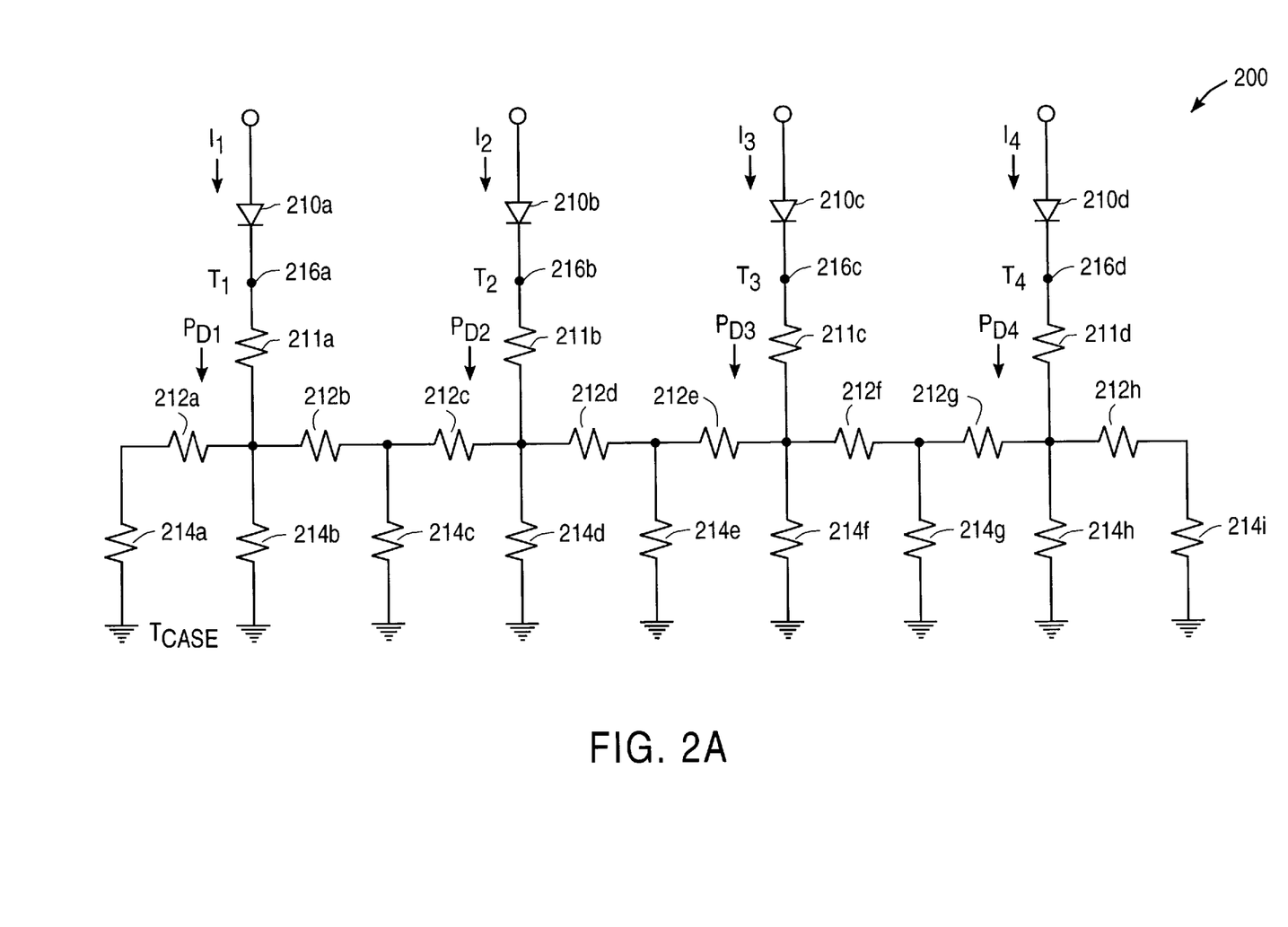
FIGS. 2A and 2B show thermal models of the conventional laser array and the laser array of the invention, respectively, using electrical networks.

FIG. 2A shows a simplified thermal model 200 of conventional laser array 100 using an electrical network. Thermal model 200 illustrates thermal crosstalk within laser array 100 using electrical analogue that simplifies (and makes intuitive) the description of the thermal characteristics of laser array 100. Within thermal model 200, each of lasers 110a through 110d in FIG. 1A is modeled by a series combination of a diode 210 and a resistor 211. The equivalent lumped thermal resistance (having units of °C./Watt) along laser substrate 112 is modeled with electrical resistors 212a through 212h (having units of ohms). Similarly, the equivalent lumped thermal resistance between laser substrate 112 and heat sink substrate 114 is modeled with electrical resistors 214a through 214i. The thermal power dissipation (in unit of Watts) of lasers 110a through 110d and other elements within laser array 100 is modeled as current sources $I_1$ through $I_4$ (having units of Amperes). The resulting temperature rises (in units of °C.) are modeled as voltages (in units of Volts).

Thermal nonlinearities reduce the accuracy of the electrical model. Thermal nonlinearities arise due to variation in thermal conductivity of semiconductors and other materials with temperature, and variations of various radiative and convective heat transfer coefficients with temperature. Often, the "large-signal" (i.e., large temperature range) behavior of a thermal system is not modeled. Rather, the "small-signal" behavior is more important since many applications require maintaining the temperature of the lasers within a narrow range. For example, for WDM communications system, the temperature of the operating lasers is maintained within a narrow temperature range of approximately 0.1° C. Within the small temperature range over which the various portions of the laser array bar operate, the thermal conductivities of the materials are essentially constant and the "small-signal" thermal model is highly linear. Thus, the various theorems for linear electronic circuits can be applied for the thermal model for the laser array package.

Thermal crosstalk is described by the fact that any change in power ($P_{D1}$–$P_{D4}$) in any of the lasers in the laser array induces a change in temperature ($T_1$–$T_4$) at the junctions of all lasers. Using the electrical analogue shown in FIG. 2A, any change in current (akin to laser power) in any of diodes 210a through 210d induces a change in voltage (akin to temperature) at nodes 216. For example, when all four laser diodes 210 are powered "on", all junction temperatures are approximately "correct" and laser diodes 210 operate at the specified output wavelengths. However, when one of laser diodes 210 is turned "off" (e.g., laser diode 210c in FIG. 2A), the temperature of other laser diodes 210a, 210b, and 210d drops as a consequence of the thermal coupling between the elements in the laser array.

The thermal coupling coefficient ($\theta_{ij}$) is defined as the ratio of the change in junction temperature at element "i" produced by a change in power dissipation in element "j", or $\theta_{ij} = \Delta T_i/\Delta P_j$. Referring to FIG. 1A, the thermal coupling coefficient relates to temperature variation at a laser site due to change in power at another site. The thermal coupling coefficient can be reduced by changes to: (1) the thickness of semiconductor laser substrate 112, (2) the thermal conductivity of heat sink substrate 114, (3) the spacing between laser stripes 130, and so on. However, known practical combinations of materials and dimensions cannot reduce the laser array thermal crosstalk level down to the required level (e.g., $\Delta T \leq 0.1$° C.). Generally, the thermal coupling coefficient decreases in magnitude as the distance between elements increases. The largest temperature drops are observed at the laser sites immediately adjacent to the laser turned "off".

Figure 2B:
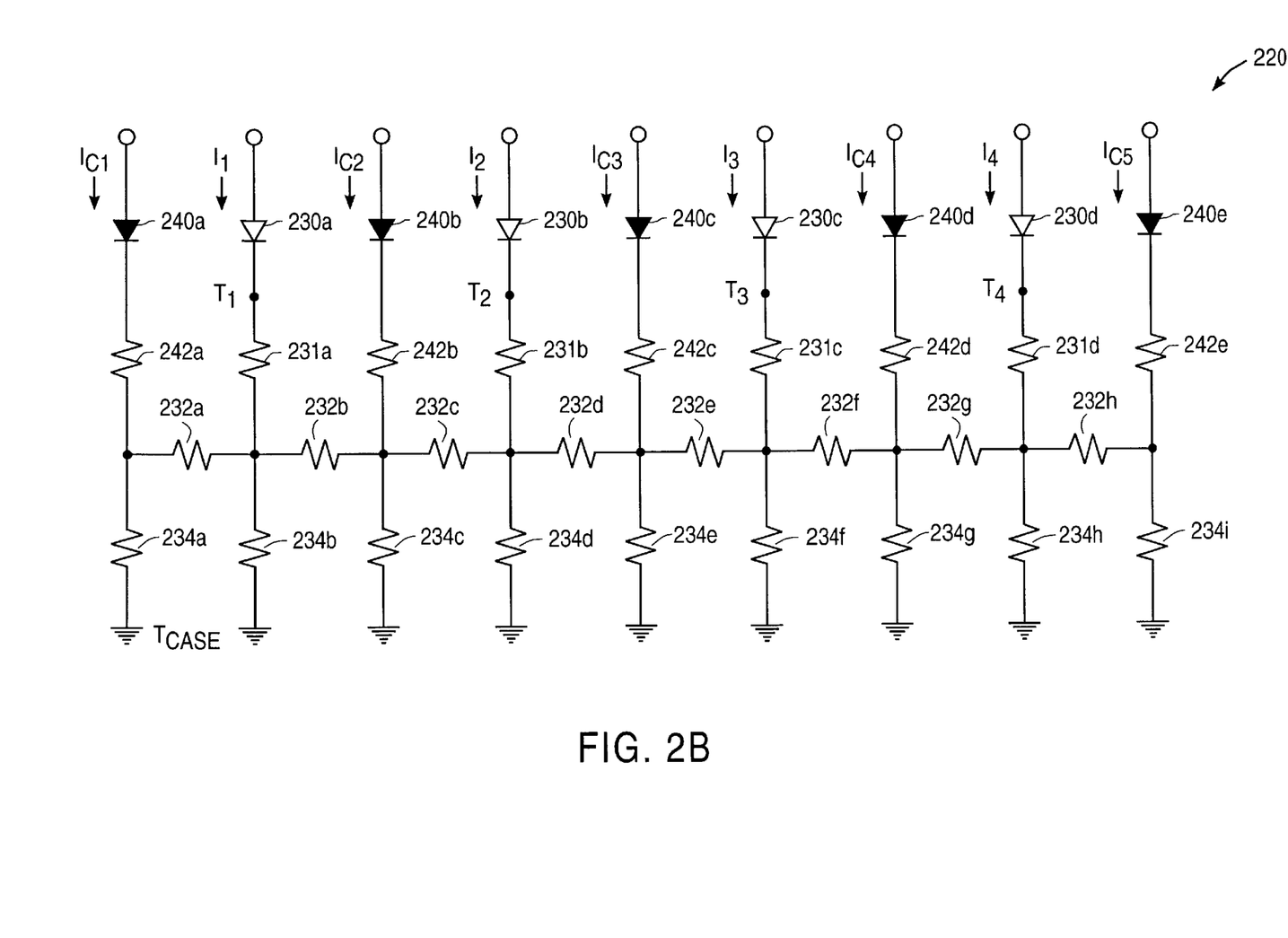

FIG. 2B shows a thermal model 220 of laser array 120 using an electrical network. Thermal model 220 includes the elements of thermal model 200 and additional elements that model dissipation elements 140. Within thermal model 220, each of lasers 130a through 130d in FIG. 1B is modeled by a series combination of a diode 230 and a resistor 231. The equivalent lumped thermal resistance along laser substrate 132 is modeled with electrical resistors 232a through 232h. Similarly, the equivalent lumped thermal resistance between laser substrate 132 and heat sink substrate 134 is modeled with electrical resistors 234a through 234i. Each of dissipation elements 140a through 140e is modeled by a series combination of a diode 240 and a resistor 242.

As shown in FIG. 2B, the addition of five interstitial dissipation elements 240 into the laser array allows for compensation of the "missing power" when any given laser diode 230 (or combination of laser diodes 230) in the laser array is turned "off". Each of dissipation elements 240 can be injected with any level of "DC" (or steady-state) power. As an example, the temperature drops at laser diodes 220a, 220b, and 220d when laser diode 220c is turned "off" (e.g., $I_3=0$). The temperature drop can be approximately compensated by applying predetermined amounts of current (i.e., controlled amounts of current $I_{C3}$ and $I_{C4}$) to dissipation elements 240c and 240d. For the simple thermal model of FIG. 2B, application of current to dissipation elements 240c and 240d adjacent to deselected laser diode 230c produces the required level of compensation at all other laser junctions in the laser array. However, in practice, it may be necessary to apply small levels of power to most, or all, dissipation elements 240 in the laser array in order to precisely compensate for the temperature change induced by turning "off" any particular laser diode or combination of laser diodes.

Compensation Techniques

The present invention provides "feed-forward" compensation techniques that minimize thermal crosstalk within a laser array. DC power (e.g., in the form of a current) is applied to one or more dissipation elements as one or more lasers are deselected from data transmission. The amount of DC power to be applied and the selection of which dissipation elements to activate depend on which combination of lasers is selected/deselected. The implementation details are described below. Typically, when a particular laser is deselected, this information is known by the system and provided to a compensation circuit. In this manner, no additional signals need to be generated.

In a feed-forward compensation system, the operating condition is sensed (i.e., to determine which lasers are selected and which lasers are deselected). This information is used to adjust the drive current of the dissipation elements. Generally, feed-forward techniques are simpler to implement and have faster response time than feedback techniques.

In a feedback compensation system, the junction temperatures (or wavelengths) of the selected lasers are sensed (i.e., through measurements), and the power levels of the dissipation elements are adjusted to drive the temperature (or wavelength) errors to zero. Feedback techniques can provide more accurate control of temperature (or wavelength). Feedback techniques also fall within the scope of the present invention.

Feed-forward and feedback techniques can be used in combination. In this implementation, a feed-forward technique is used to compensate for power variations (i.e., by adjusting currents $I_{C1}$–$I_{C5}$ in FIG. 2B) as different combinations of lasers are selected/deselected. The temperatures (or wavelengths) of the lasers are then measured. This information is then used to refine the feed-forward compensation values. The feedback technique can be used to correct for device aging, or other effects. Furthermore, the feedback technique can be operated at a (relatively) slow rate.

The feed-forward/feedback compensation system can also be used to provide calibration of the laser array to update the compensation values within a lookup table. This calibration can be performed at the factory during the manufacturing phase, or dynamically during operation of the laser array. Look-up Table for Compensation Values p In one embodiment, the compensation drive signals for dissipation elements 140 are provided by a look-up table. For each combination of selected/deselected lasers, the look-up table provides power values for zero or more dissipation elements that result in maintaining the temperatures of the selected lasers at the required operating temperatures.

Figure 3:
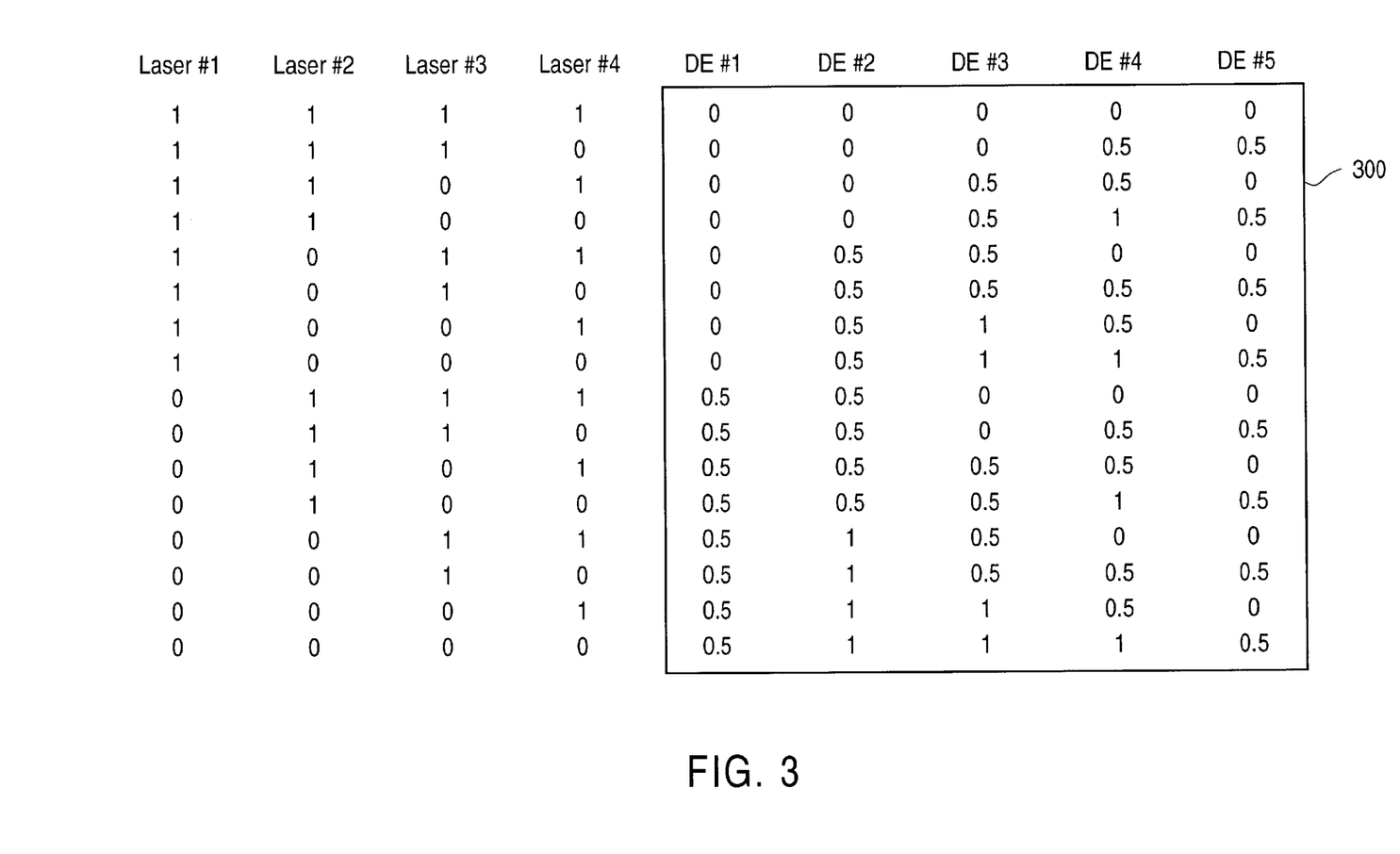
FIG. 3 shows a compensation lookup table.

FIG. 3 shows a compensation lookup table 300 for the active compensation of the present invention. For ease of illustration, some simplifications are made. First, a simple thermal model is assumed (i.e., similar to that of FIG. 2B) wherein only the dissipation elements adjacent to a deselected laser are powered "on" to provide the required compensation at all other selected laser junctions. Second, the laser power level is unity when selected and zero when deselected. Finally, a power level of 0.5 in the dissipation elements adjacent to the deselected laser is assumed to provide the required compensation at all laser junctions within the laser array.

As shown in FIG. 3, the lookup table for a laser array having $N_L$ lasers includes $2^{N_L}$ rows, or 16 rows for the $N_L=4$ laser array shown in FIG. 1B. Each row corresponds to a particular laser configuration. In each row there are $N_D$ power entries, where $N_D$ is the number of dissipation elements in the array ($N_D=5$). Each entry in table 300 represents the power level to be delivered to the respective dissipation elements for the row's particular laser configuration. Although only two bits of resolution (e.g., values of 0, 0.5 and 1) is shown for each entry in table 300, 8-bit to 12-bit precision entries may be more appropriate in actual applications.

Hardware Implementation

Figure 4:
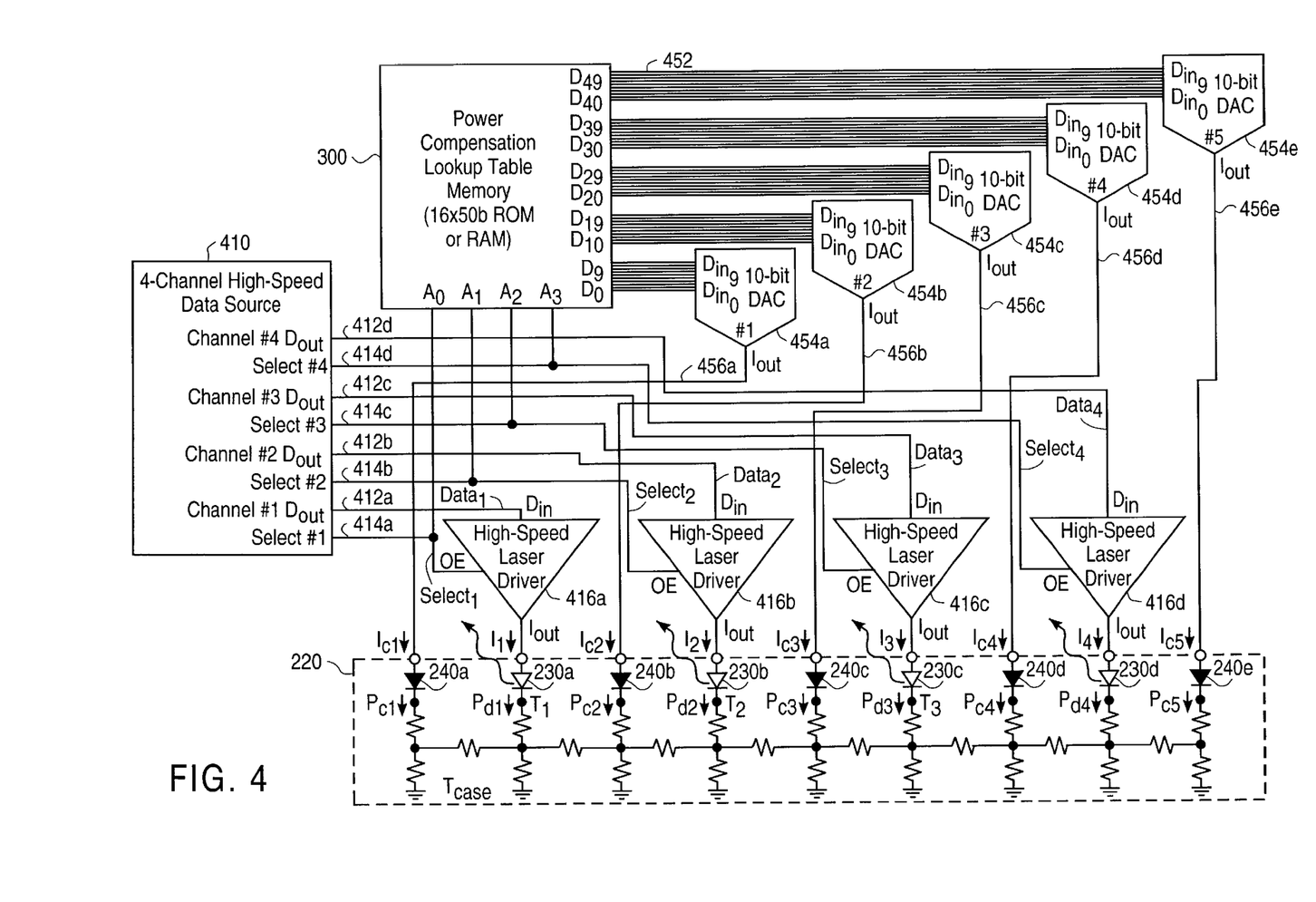
FIG. 4 is a diagram of an embodiment of a circuit used to provide active compensation.

FIG. 4 is a diagram of an embodiment of a circuit 400 used to provide active compensation. Circuit 400 includes a high-speed data source 410 that provides high speed data signals on $N_L$ lines 412 and control signals on $N_L$ lines 414. The control signals select and deselect lasers 230 within laser array 220 and the high speed data signals determine the pattern and timing of the forward bias current pulses provided to laser diodes 230. Lines 412 and 414 couple to high-speed laser drivers 416 that provide the current drive signals to the respective laser diodes 230 within laser array 220.

The control signals on lines 414 are also provided to compensation lookup table 300 that contains the compensation values for dissipation elements 240 within laser array 220. The control signals define the operating state of laser array 220 and are used to address a row within lookup table 300. Similar to lookup table 300 in FIG. 3, each row in lookup table 300 includes five entries for five compensation values for the five dissipation elements 240. The five compensation values (shown as five 10-bit parallel data paths in FIG. 4) are provided on lines 452 to corresponding digital-to-analog (DAC) converters 454. DACs 454 provide analog current outputs (corresponding to the compensation values) to dissipation elements 240 through lines 456.

Many alternative circuit designs can be used to achieve the functionality described herein. In particular, active compensation can be provided by the use of digital circuits, a processor, a digital signal. processor (DSP), a controller, an application specific integrated circuit (ASIC), memory devices, combinatorial logic, and others. Any of the above devices can be utilized if the operating speed of the device is fast enough to alter the current of dissipation elements 240 (e.g., $I_{c1}$–$I_{c5}$ in FIG. 4) in response to changes in the control signals on lines 414. The device response time should be short in comparison to the thermal time constant of the laser array and package combination. Typically, sub-microsecond response is adequate.

Although circuit 400 is shown having five separate DACs, one for each dissipation element 240, this is not absolutely required, since analog sample-and-hold (S/H) circuits can be used to store five different output values from a single DAC. This approach could be used as long as a DAC having an adequate operating speed to permit the analog demultiplexing with the S/H circuits to occur at the requisite response rates. The S/H circuits would also have the required current outputs to drive dissipation diodes 240.

As shown in FIG. 4, interstitial dissipation elements 240 between lasers 230 in laser array 220 are implemented as non-lasing dissipation diodes. For dissipation diodes, either current-source output DACs (for a common-cathode array as shown in FIG. 4) or current-sink DACs (for a common-anode array) can be used. Current-source output DACs can provide a more stable and linear relationship between DAC setting and power dissipation in the device, and can also provide a degree of matching between power dissipation in dissipation elements 240 and lasers 230 (which are also typically current driven).

Lookup table 300 contains the compensation values as shown in FIG. 3. Lookup table 300 can be implemented using a non-volatile memory device such as a read only memory (ROM), an electronically programmable ROM (EPROM), an erasable and electronically programmable ROM (EEPROM), a battery-backed random access memory (RAM), a Flash RAM, or other devices. Lookup table 300 can also be implemented using a volatile memory device such as a RAM, and other devices, providing suitable data is available at startup or after any cause of data loss.

Lookup table 300 generally requires a small memory in comparison to the typical on-chip memory capabilities of commercial ASIC or custom IC processes. As noted above, for a four-laser array ($N_L=4$), $2^{N_L}=16$ addresses are needed for lookup table 300. Similarly, for an 8-laser array ($N_L=8$), 256 addresses are needed. In one embodiment (i.e., as illustrated in FIG. 4), each DAC 454 has 10 bits of resolution. For the $N_L=4$ laser array that contains $N_D=5$ dissipation elements, wherein each dissipation element 240 is driven with 10 bits of resolution, the number of data bits for each memory address is $N_W=10 \cdot N_D=50$ bits and the number of data bits for lookup table 300 is $N_B=N_W \cdot (2^{N_L})=50 \cdot 16=800$ bits (or 100 bytes). For a larger $N_L=8$ laser array, the memory word width is $N_W=90$ bits and the number of data bits for lookup table 300 is $N_B=90 \times 256=23,040$ bits (or 2880 bytes). Therefore, even for an 8-laser or even larger laser arrays, the control circuitry required to implement active compensation can fit on a single, small and inexpensive IC chip. Hence, the compensation circuit can be implemented without significantly impacting system costs.

Applications for Active Compensation

Active compensation has been described for reducing thermal crosstalk between lasers within a laser array when one or more lasers are deselected. Active compensation can also be used to improve manufacturing yields of laser arrays. As discussed above, manufacturing yields are typically not problematic for individually packaged lasers since "tweaking" can be performed on the setpoint of the thermoelectric (TE) cooler/controller that accompanies each laser to provide the specified operating wavelength. However, the single adjustment provided by the TE cooler/controller cannot independently adjust the wavelengths of all lasers in a laser array such that each operates at its specified wavelength.

Expressed mathematically, a single input variable (e.g., $T_{case}$ in FIG. 2A) cannot independently control the temperature of $N_L$ laser junctions, except when $N_L=1$. In laser array 220 of FIG. 2B, there are $N_L+2$ variables ($T_{case}$ plus $N_L+1$ adjustable dissipation elements).

To provide wavelength adjustment of the lasers within a laser array, one or more dissipation elements can be driven with predetermined amounts of power such that the wavelengths of all lasers in the laser array are within specifications. The compensation values are stored in a lookup table for use during normal operation. For example, when all lasers within the laser array are selected for data transmission (e.g., all "on"), no compensation power is normally required if the lasers are operating at their specified wavelengths. This can be shown by the zero entries in the first row of lookup table 300 in FIG. 3. However, if one or more lasers is not operating at the specified wavelength, compensation values can be entered in the lookup table for a set of dissipation elements. The compensation values provide the required change in laser junction temperatures (e.g., $T_1$–$T_4$ in FIG. 2B or 4) so that all lasers operate at their specified wavelengths. The compensation values are generally calculated for a nominal TE cooler setting (e.g., $T_{case}$)

When active compensation is used to reduce the effects of thermal crosstalk as lasers in the array are deselected, no additional power is dissipated. The power dissipated by the dissipation elements makes up for the power that would have been dissipated by the deselected lasers. Thus, the total power dissipated in the array typically does not exceed the power dissipated when all lasers are selected and no dissipation elements are turned "on". Therefore, the thermal capacity required for the TE cooler is the same as that for an uncompensated array.

Using active compensation to "tweak" the wavelengths of lasers in the laser array can result in additional power dissipation. The total power dissipation in the array is the sum of the power dissipated by the lasers plus the power dissipated by the dissipation elements. The dissipation elements are operated at power levels required to establish the thermal gradients between array elements needed to get all lasers operating at their specified wavelengths. If the initial laser wavelengths are close to their specified values, the temperature gradients required for "tweaking" are small and the required additional power is minimal.

However, there is a practical limit to how much temperature "tweaking" can be performed. One such limit is based on the ability of the TE cooler to dissipate power. Thus, the range of "correctable" errors for the lasers is limited by practical limits on the TE cooler capacity. Additional limits are provided by the thermal crosstalk between elements in FIG. 2B or FIG. 4, since each dissipation element 240 is strongly thermally coupled to adjacent lasers 230 on each side. This places some practical limits on the temperature gradients that can be achieved in the laser array bar 132. If the dissipation elements were placed very close to the laser stripes, or if a pair of dissipation elements were closely spaced on either side of each laser, a higher degree of adjustment could be realized (and junction temperatures in "off" lasers could be maintained closer to their "n" temperatures for reduced turn-on transient "chirp").

In a well-controlled laser array manufacturing process, the wavelength errors are typically small. The small errors can still be catastrophic for yielding laser arrays having all lasers operating at the specified wavelengths without individual temperature adjustment. In such case, the independent temperature "tweaking" capability provided by the invention can produce substantial improvement in the yields of laser arrays with only a modest increase in total array power dissipation.

Generating the Compensation Values by Use of Thermal Modeling

A possible method for calculating the compensation values for the look-up table is to derive these values by first calculating (e.g., by computer thermal simulation) the temperature distribution function for all elements (including the lasers and dissipation elements) in the array. The temperature distribution function is determined by providing power to a particular narrow stripe (e.g., a laser or a dissipation element) on a semiconductor bar such as that illustrated in FIG. 1B. This power dissipation produces a change in temperature in the semiconductor bar and the associated package that varies in the x, y, and z directions. In one embodiment, x is the direction along the length of the bar (measured from its center), y is the vertical direction (perpendicular to the heat sink plane in FIG. 1B), and z is the direction along the laser stripe. The temperature distribution is determined by the thermal conductivity and dimensions of various materials, in accordance with Poisson's equation (which reduces to Laplace's equation outside the regions where there is power dissipation). The T(x,y,z) temperature distributions can be obtained by computer simulation using a 3-D solver.

Referring to FIG. 1B, if the heat sink did not extend in the z-direction past the edges of the laser bar and the stripe was uniformly heated, then the T(z) variation is negligible. The temperature distribution then reduces to a 2-dimensional distribution function T(x,y) that can be obtained using a 2-D solver. Further simplification can be made by noting that the active devices of interest are essentially on the top surface (e.g., y=0) of the semiconductor bar. Thus, the 2-D distribution can be further simplified to a one-dimensional distribution function T(x) for y=0, or just T(x) for short. Even in cases which are not 2-dimensional, the z-axis variation in temperature at the top surface (y=0) of the bar is not very large. Thus, the T(x) distribution represents the average (in z) temperature at the top surface of the bar at position x along the bar.

As noted above, the T(x) temperature distribution function can be obtained for specific cases of interest by the use of a 2-D or 3-D solver. For the following discussion, for simplicity, T(x) is chosen to be a simple exponential function:

$$T(x) = P_o \cdot \exp(-|x-x_o|/L_e), \qquad \text{Eq. 1}$$

where $L_e$ is a characteristic attenuation length for the temperature distribution function. For a narrow stripe located at $x=x_0$ and powered with power $P_0$, the temperature change (at the y=0 surface) versus position (x) induced by that power $P_0$ is given by T(x) in accordance with equation 1. (For simplicity, the proportionality constant between maximum temperature and power has been taken as unity in equation 1).

Figure 5:
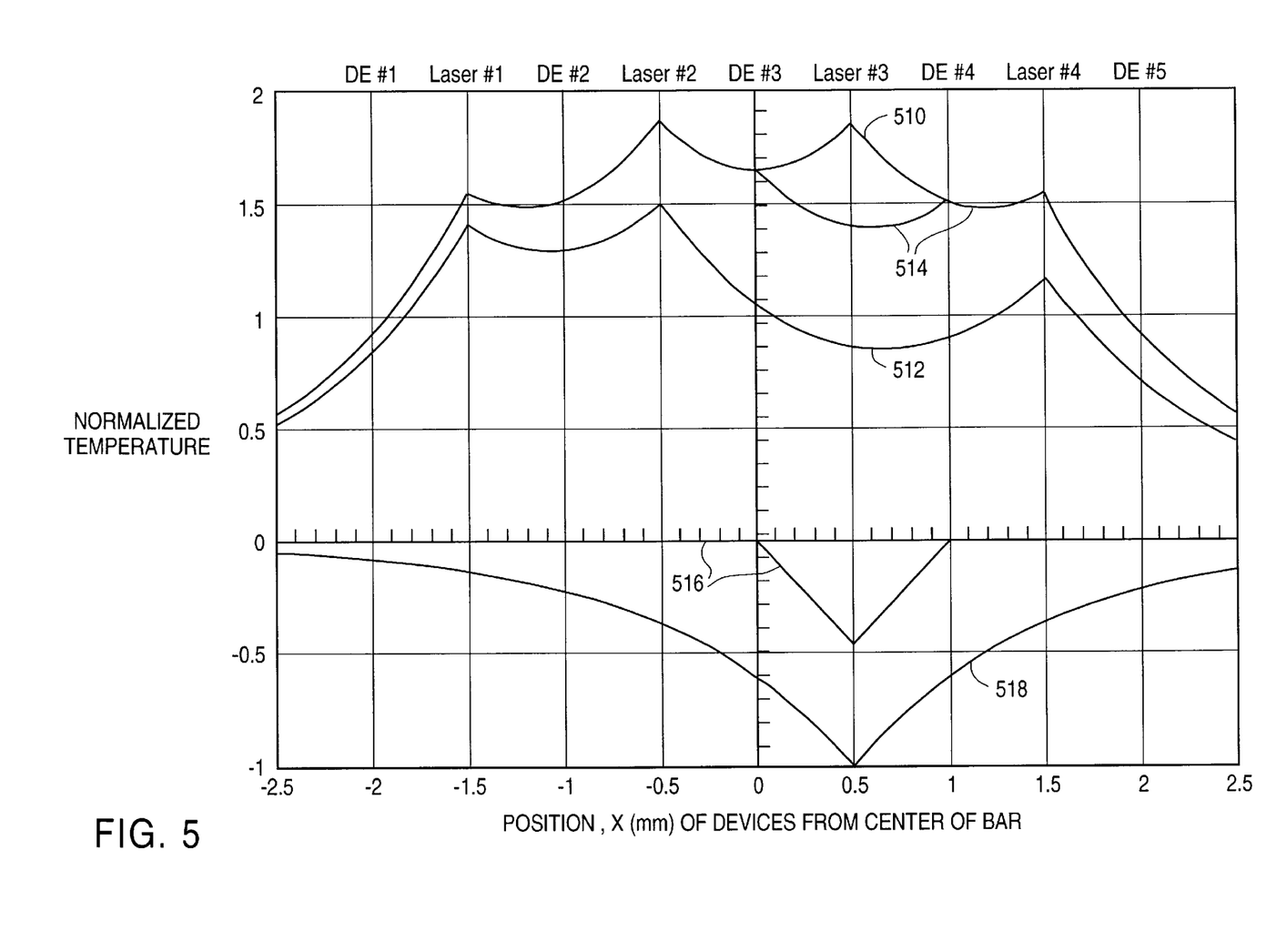
FIG. 5 shows temperature distribution functions for various conditions within the laser array.

FIG. 5 shows an exponential temperature distribution function 510 for a laser array. FIG. 5 corresponds to the four-laser array 120 shown in FIG. 1B. Lasers 130a, 130b, 130c, and 130d are located at x=−1.5 mm, −0.5 mm, +0.5 mm and +1.5 mm, respectively, with x being measured from the center of laser array bar 132. The spacing between lasers 130 is 1.0 mm. Dissipation elements 140a, 140b, 140c, 140d, and 140e are located at x=−2 mm, −1 mm, 0, +1 mm, and +2 mm, respectively.

As discussed above, the "small signal" thermal model for the laser array/package is approximately linear. Thus, the superposition theorem applies and the total temperature rise at any point x produced by a number of power (i.e., thermal dissipation) sources is simply the sum of the contributions from each of the individual sources. This property indicates that the thermal system can be characterized experimentally, with one power source turned "on" at any given moment. For example, all power sources are initially turned "off". Then a source j is turned "on" and the temperature rise at the point of interest x is measured to obtain a thermal coupling coefficient $\theta_{xj}$ between that source j at that point x. The coefficient $\theta_{xj}$ can be computed as the ratio of the measured temperature rise at point x divided by the change in source power, or $\theta_{xj}=\Delta T(x)/\Delta P_j$. Through superposition, with all combinations of these sources powered, the total temperature rise T(x) at point x due to source powers $P_j$ can be obtained by summing the product of each of the source powers times its thermal coupling coefficient to point x. This can be expressed by the following equation:

$$T(x)=P_1\theta_{x1}+P_2\theta_{x2}+P_3\theta_{x3}+\ldots=\Sigma P_j\theta_{xj} \quad \text{Eq. 2}$$

where the sum is taken over all sources (i.e., those having non-zero power).

Exponential temperature distribution function 510 is computed using equations 1 and 2 with an $L_e$=1.0 mm characteristic attenuation length. Function 510 in FIG. 5 shows T(x) with all four lasers 130 powered "on" (e.g., at $P_j$=1 unit of power) and all dissipation elements 140 turned "off". The laser temperature under this condition is defined as the reference temperature (i.e., zero error), since lasers 130 are assumed, for this example, to operate at their specified wavelengths when all four lasers 130 are powered "on".

FIG. 5 also shows a temperature distribution function 512 for an uncompensated laser array and a temperature distribution function 514 for a compensated array using active compensation. When laser 130c (at x=+0.5 mm) is turned "off", the uncompensated temperature distribution function 512 "sags" with respect to function 510. The drop in temperature at adjacent lasers 130b and 130d (e.g., 0.368 units) is more than at laser 130a (e.g.,0.135 units). These (usually unacceptable) temperature drops can be compensated by applying power (e.g., $e^{-0.5}/(1+e^{-1})$=0.44341 units) to dissipation elements 140c and 140d adjacent to the deselected laser 130c. Turning "on" dissipation element 140c and 140d results in compensated temperature function 514. An error function 516 shows the temperature error between reference temperature function 510 and compensated temperature function 514. In this simple model, by powering "on" only dissipation diodes 140c and 140d adjacent to the "off" laser 130c, the temperature error is zero at all points x outside of the region 0<x<1.0 mm. Error function 516 is an improvement over an error function 518 that is the difference between the reference temperature function 510 and the uncompensated temperature function 512.

Active compensation can also improve the performance of the lasers that are turned "off". Referring to FIG. 5, even at the site of the "off" laser 130c, the temperature drop is reduced (e.g., by a factor of 1.86) by the use of active compensation. Generally, the steady-state temperature of a deselected laser is unimportant, since it has no influence on the wavelengths of the selected lasers. However, when a deselected laser is subsequently selected for data transmission (i.e., turned back "on"), the wavelength of this laser experiences a short transient "chirp" as the laser temperature adjusts from the "off" temperature to the normal steady-state "on" temperature. By maintaining the temperature of a deselected laser closer to its steady-state "on" temperature, the magnitude of the "chirp" is reduced. In fact, the magnitude of the "chirp" can be further reduced by increasing the number of dissipation elements (e.g., from $N_D=N_L+1$ to $N_D=2N_L$), or locating the dissipation elements as close as possible on either side of each laser in the laser array, or both.

Error function 516 indicates that the temperature error caused by deselecting laser 130c is compensated at all points x outside of the region between compensation dissipation elements 140c and 140d. Error function 516 also suggests that only dissipation elements adjacent to the deselected lasers 130c need to be powered "on" to achieve compensation. These two properties result from the use of a simple exponential temperature distribution function (e.g., equation 1) and would not be expected to be realized in typical real packaged laser array configurations.

Generally, reduction in temperature error can be achieved at a limited number of discrete points $x_i$ along the laser array bar. Furthermore, most or all dissipation elements may need to be turned "on" to provide the required level of compensation. This is because the actual temperature distribution function on an array bar is typically more complex than a simple exponential function.

Typically, only the selected ("on") lasers need accurate compensation of their junction temperatures to ensure operation of these lasers at their specified wavelengths. The temperature at other locations along the laser array bar is typically unimportant. For the four-laser array shown in FIGS. 1B and 5, only accurate temperature control at lasers 130a, 130b, 130c, and 130d is required.

Generating the Compensation Values Experimentally

The thermal characteristics of the laser array in its package, with its TE cooler, can be characterized by the use of thermal coupling coefficients. In particular, the laser junction temperatures can be determined by using, for any given combination of device powers (lasers and dissipation elements) in the array, the coupling coefficients from all power dissipation sources to each of the lasers.

The package can be characterized separately from the TE cooler/controller that maintains the nominal substrate temperature, $T_{case}$. The TE cooler/controller can be specified as part of the boundary conditions that are the constraints under which the thermal coupling coefficients are determined. The temperature setpoint of the TE cooler/controller provides an additional temperature offset that is applied equally and in common to all laser junctions.

The thermal characteristics of the laser array, package, and TE cooler/controller can be characterized experimentally by powering "on" all lasers with the TE cooler/controller operating in normal condition. This provides the nominal "large-signal" operating conditions for the laser array around which "small-signal" (i.e., small temperature swing) power-temperature variations can be presumed to be linear.

The power-temperature function relates to temperature change versus power dissipation change. Thus, for thermal analysis, the thermal coupling coefficients are measured by temperature and thermal power dissipation changes for each source. For non-lasing dissipation elements, the thermal dissipation (in watts) is the electrical input power, or the product of the forward current times the forward voltage drop. For lasing diodes (e.g., lasers), the thermal power dissipation is the difference between the electrical power input and the optical power output. For the lasers, this thermal power dissipation is generally the power difference between the selected ("on") state and the deselected ("off") state. Since the change in power between these states is compensated, a systematic error in estimating the thermal dissipation of the lasers can be compensated for by a linear scaling correction of all thermal coupling coefficients.

The power-temperature relationships can be concisely expressed using matrix algebra. For the $N_L=4$ laser array 120 shown in FIG. 1B, the temperature at the four laser junctions are denoted as $T_i$, where i=1, 2, 3 and 4. There are nine thermal sources in compensated laser array 120, which can be identified as j=1 through 9, with j=1 through 4 corresponding to the four lasers 130 and j=5 through 9 corresponding to the five dissipation elements 140. The temperature change at laser junction i is given as:

$$T_i = \theta_{i1}P_{L1} + \theta_{i2}P_{L2} + \theta_{i3}P_{L3} + \theta_{i4}P_{L4} + \theta_{i5}P_{C5} + \theta_{i6}P_{C6} + \theta_{i7}P_{C7} + \theta_{i8}P_{C8} + \theta_{i9}P_{C9}$$

$$= \sum \theta_{ij} P_j \quad \text{Eq. 3}$$

In matrix notation (with the matrix quantities noted in brackets), equation 3 can be expressed as:

$$[T_i]=[\theta_{ij}][P_j], \text{ tm Eq. 4}$$

where $[P_j]$ is a single column matrix having nine rows that hold the $P_{L1}$–$P_{L4}$ and $P_{C5}$–$P_{C9}$ power dissipation values, $[\theta_{ij}]$ has nine columns and four rows that hold the thermal coupling coefficients, and $[T_i]$ is a single column matrix having four rows that hold the laser temperature change values, $T_1$–$T_4$, resulting from the device power combination specified by $[P_j]$.

Calculating Compensation Values for "Calibrated" Array

One case of interest is when laser array 120 is itself "calibrated", which means that with all four lasers 130 powered "on" and all dissipation elements 140 turned "off", lasers 130 operate at their specified wavelengths. Equation 4 can then be used to solve for values for $P_{C5}$–$P_{C9}$ needed to drive dissipation elements 140 to compensate for one or more deselected ("off") lasers 130.

The solution for equation 4 is not unique since there are five independent variables ($P_{C5}$–$P_{C9}$) available to control four results ($T_1$–$T_4$) (or fewer when some lasers are deselected). Thus, additional constraints (such as minimum total power, and so on) can be applied to the selection of $P_{C5}$–$P_{C9}$. The $P_{C5}$–$P_{C9}$ values are then used to derive the (e.g., drive current) values for the feed-forward lookup table (e.g., table 300 in FIG. 3).

The set of laser temperatures when all four lasers 130 are selected and operating at their specified wavelengths may be defined as the reference temperatures from which all temperature changes are measured. In this case, the laser power entries for deselected lasers 130 are taken as negative values, with the magnitude being the difference between the selected ("on") and deselected laser power levels. All nine elements of the $[P_j]$ matrix are zero for this reference condition. The power values of dissipation elements 140 are derived, using Equation 4, by: (1) setting all elements of the $[T_i]$ matrix corresponding to selected lasers equal to zero (i.e., no change in junction temperature), (2) replacing the zero values for the deselected lasers in the first four $[P_j]$ matrix entries with the appropriate (negative) power values, and (3) solving for the five ($P_{C5}$–$P_{C9}$) power values for the dissipation elements. The values for the feed-forward lookup table are then derived from the ($P_{C5}$–$P_{C9}$) power values and further using the power-current relationship for dissipation elements 140.

Calculating Compensation Values for Array with Internal Wavelength Errors

As stated above, active compensation can also be used for temperature "tweaking" of the laser junction temperatures so that all lasers in the laser array operate at their specified wavelengths. In this embodiment, the wavelength error and the temperature-wavelength coefficient is determined for each laser. From this information, the change in temperature (i.e., from the reference temperature) required for a particular laser to operate at its specified wavelength is calculated. From the required change in temperature, the compensation value for the lookup table can be determined. For this embodiment, the same process as described above can be used. However, equation 4 is solved for each combination of selected/deselected lasers and with the elements of the $[T_i]$ matrix equal to the required temperature change (instead of zero values for $T_1$–$T_4$ as described above). The resulting dissipation power values simultaneously compensate for both the initial wavelength errors in the laser array and thermal crosstalk as various lasers are selected/deselected for data transmission.

Laser Chip Module

Figure 6A:
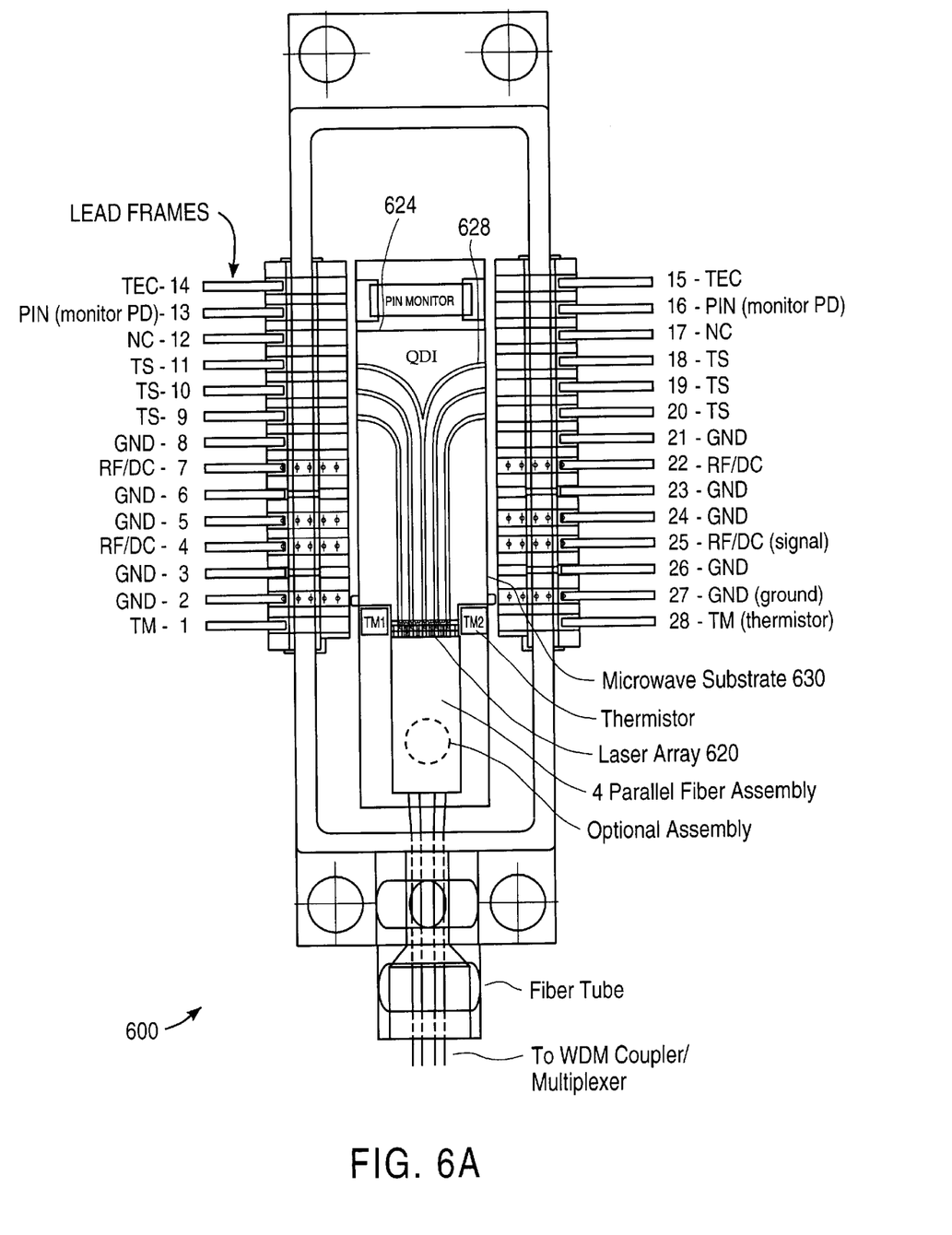
FIG. 6A shows a top sectional view of a packaged module incorporating a laser array.

FIG. 6A shows a top sectional view, drawn generally to scale, of a packaged module 600 incorporating a laser array 620. Package module 600 is described in detail in U.S. patent application Ser. No. 09/031,496, entitled "TECHNIQUE FOR FABRICATING AND PACKAGING MULTI-WAVELENGTH SEMICONDUCTOR LASER ARRAY DEVICES (CHIPS) AND THEIR APPLICATIONS IN SYSTEM ARCHITECTURES", filed Feb. 26, 1998, assigned to one of the assignees of the present invention, and incorporated herein by reference.

In one embodiment, a multi-layer circuit assembly is used to provide drive signals for the lasers and dissipation elements within laser array 620. The multi-layer circuit assembly includes a first layer 622 (not shown in FIG. 6A) for providing drive signals to the lasers, and a second layer 624 to provide drive signals for the dissipation elements. Each of layers 622 and 624 includes a signal side and a backside.

FIG. 6A shows a layout of second layer 624. Signal lines 628 for the dissipation elements are implemented as metal traces on a substrate 630. As shown in FIG. 6A, no ground lines are provided between signal lines 628, since the drive signals for the dissipation elements are relatively slow speed signals. The backside of second layer 624 can include a ground plane.

Figure 6B:
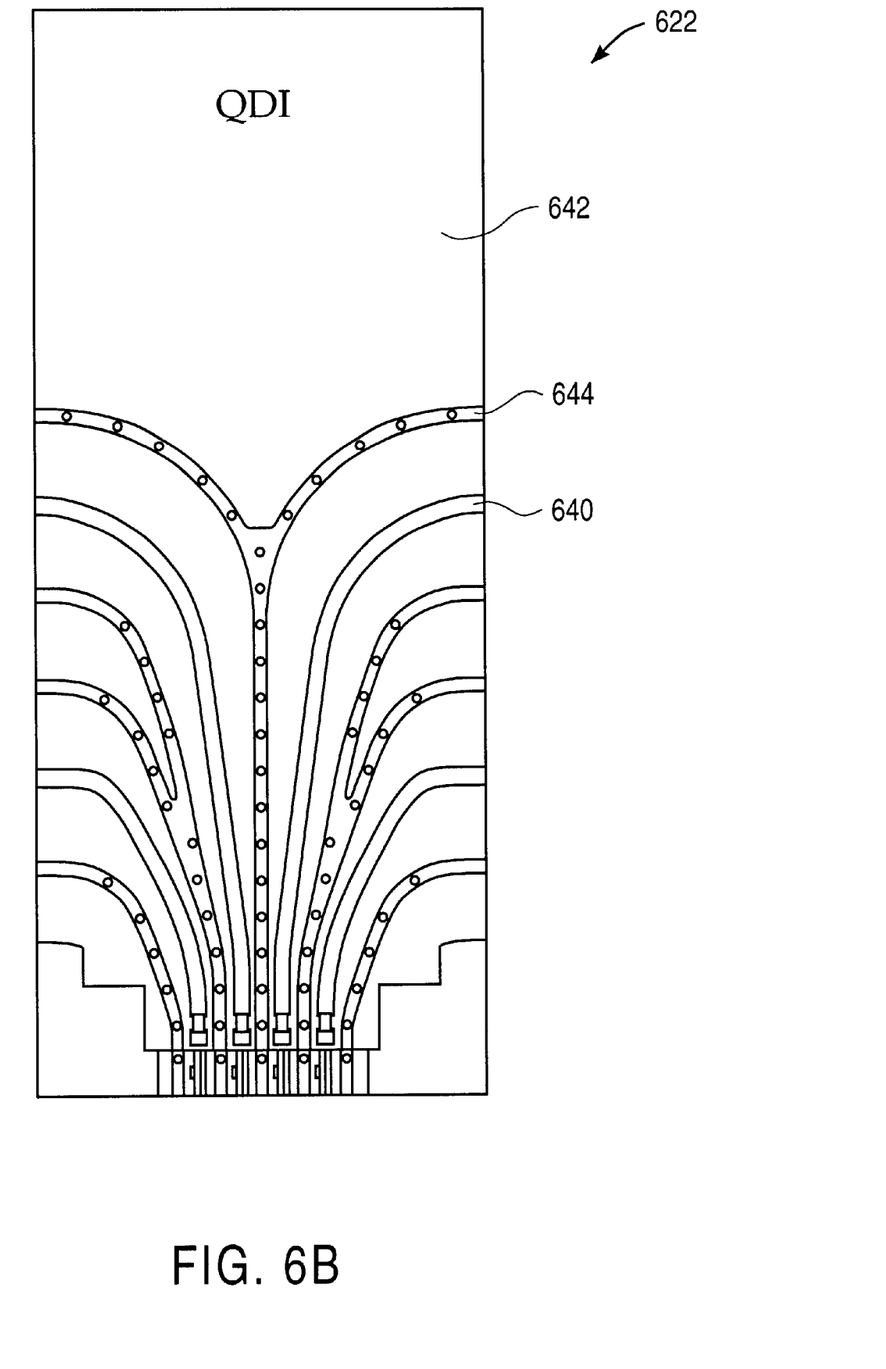
FIG. 6B shows a layout of a first layer.

FIG. 6B shows a layout of first layer 622. RF/DC transmission lines 640 carry the RF modulation signals from laser driver circuits (not shown) and are implemented as metal traces on a substrate 642. Substrate 642 can be different or the same material as substrate 630. FIG. 6B shows a simplified RF/DC shielding scheme wherein each RF/DC transmission line 640 is bounded by on both sides by ground lines 644 that are also implemented as traces on substrate 642 with via holes through the substrate to a backside ground plane. The via holes can be implemented in various manners (i.e., with different hole shapes, sizes, and possibly metallization schemes) as described in the aforementioned patent application Ser. No. 09/031,496. The transmission lines and the ground lines may be of constant width. Alternatively, one or more RF/DC transmission lines may be tapered in order to provide optimum impedance matching, minimum return loss, and reduced crosstalk. The layout of first layer 622 is also further described in the aforementioned U.S. patent application Ser. No. 09/031,496. RF/DC transmission lines 640 can be, for example, 50 ohm or 25 ohm impedance transmission lines.

Various modifications can be made to the layout of FIG. 6B to improve crosstalk between RF/DC transmission lines 640. For example, ground jumpers can be placed over RF transmission lines 640, with the ends of the jumpers connected to ground lines 644 on both sides of the respective RF/DC transmission lines. Also, via holes of various sizes and shapes can be used. Patches of ground planes can further be placed throughout the layout to reduce crosstalk.

Layers 622 and 624 can be placed on top of one another, like a sandwich. In one configuration, first layer 622 is oriented such that its backside ground plane is mounted against a TE cooler/controller, and second layer 624 is oriented such that its backside ground plane is located adjacent to the signal side of first layer 622. Via holes can be made on second layer 624 to provide the required connections to first layer 622 located underneath second layer 624. Other configurations are possible and are within the scope of the present invention.

Additional elements within module 600 not described herein are further described in the aforementioned U.S. patent application Ser. No. 09/031,496.

Figure 6C:
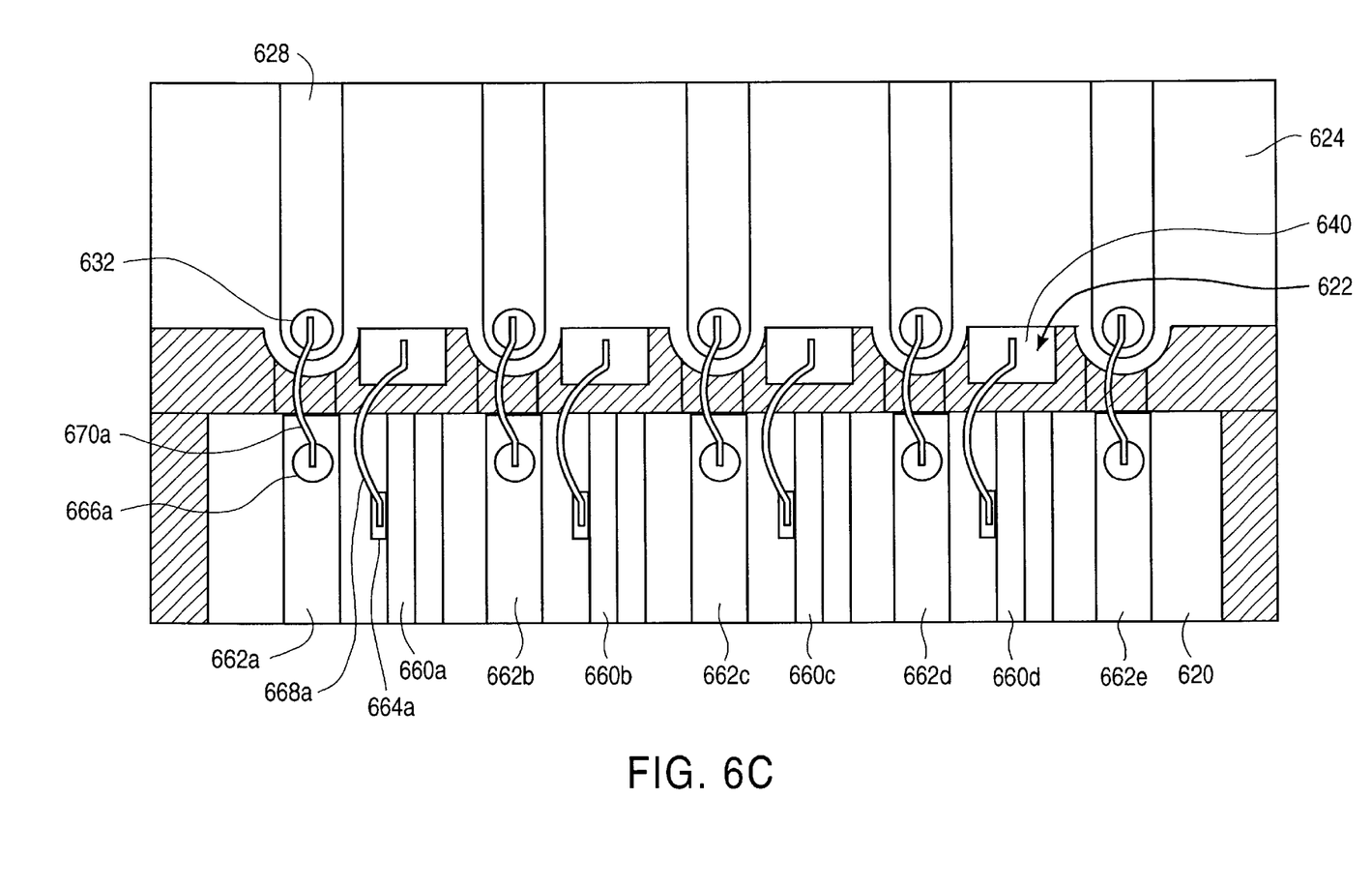
FIG. 6C is a detailed diagram showing the interconnections between the laser array and the first and second layers.

FIG. 6C is a detailed diagram showing the interconnections between laser array 620 and first and second layers 622 and 624. As shown in FIG. 6C, second layer 624 is placed on top of first layer 622 such that only the (four) ends of RF/DC transmission lines 640 of first layer 622 are exposed. Each signal line 628 of second layer 624 includes a contact pad 632.

Laser array 620 includes four lasers 660a through 660d and five dissipation elements 662a through 662e. Each of lasers 660 and dissipation elements 662 is coupled to an associated contact pad 664 and 666, respectively. Contact pad 664 couples to corresponding RF/DC transmission lines 660 through a bond wire 668. Similarly, contact pad 666 couples to corresponding contact pad 632 of signal lines 628 through a bond wire 670.

Figure 6D:
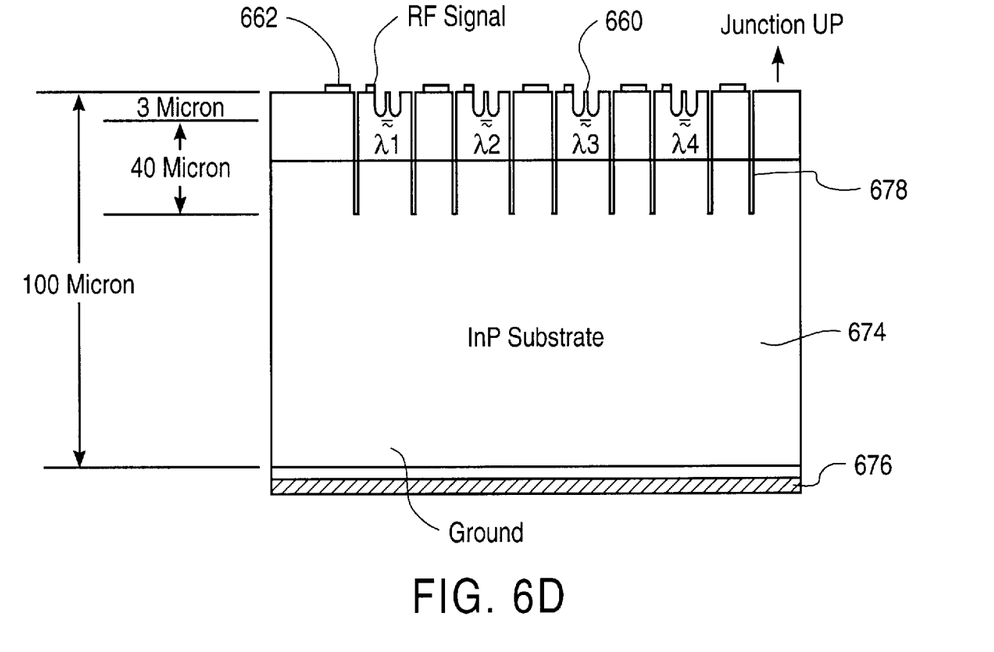
FIGS. 6D and 6E show side views of two possible configurations referred to as junction up and junction down, respectively, for mounting the laser array to a packaged module.
Figure 6E:
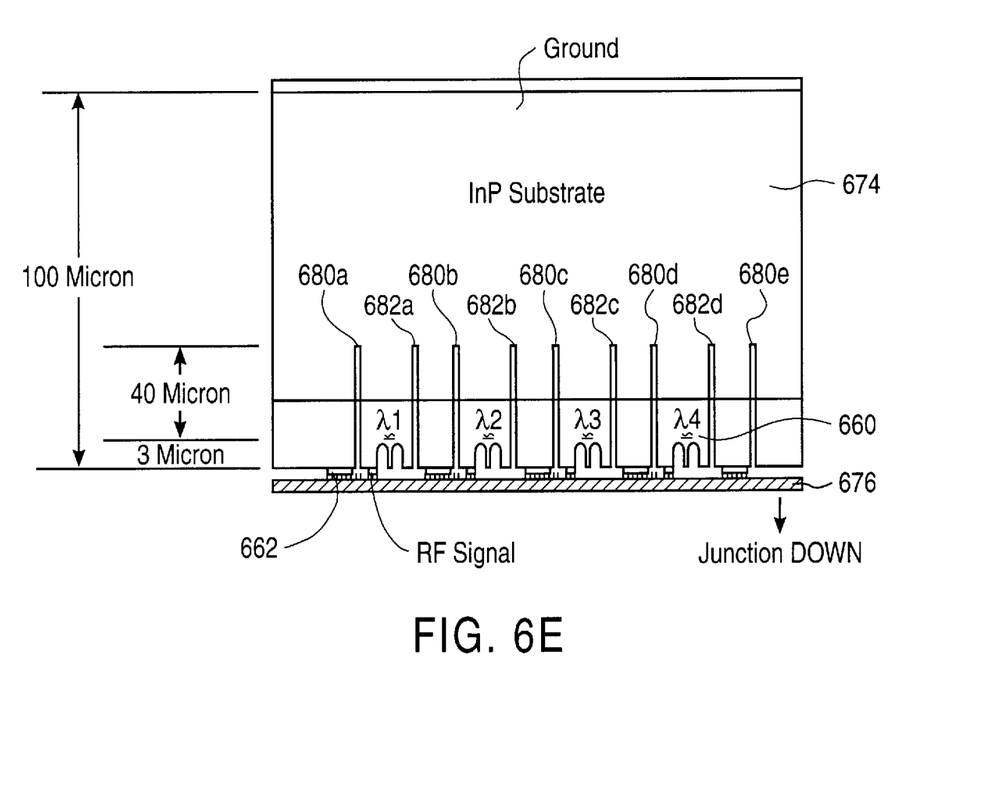

FIGS. 6D and 6E show side views of two possible configurations referred to as junction up and junction down, respectively, for mounting laser array 620 to packaged module 600. In the junction up configuration shown in FIG. 6D, laser array 620 is mounted such that its substrate 674 is coupled to a microwave substrate or heatsink 676. This configuration allows for easy access to lasers 660 and dissipation elements 662. Heatsink 676 removes a substantial portion of the heat generated by the lasers and dissipation elements of laser array 620. However, the heat needs to travel through substrate 674 of laser array 620 before reaching heatsink 676. Slots 678 dispersed along laser array 620 provide thermal isolation between lasers 660. Slots 678 assist in isolating the heat generated by one laser from affecting the temperature of other lasers in the array.

In the junction down configuration shown in FIG. 6E, laser array 620 is mounted such that lasers 660 and dissipation elements 662 are coupled more directly to heatsink 676. This configuration provides for more efficient heat transfer and can result in better performance. However, in this configuration, lasers 660 and dissipation elements 662 are not as readily accessible. Ground slots 680a through 680e are provided along laser array 620 to provide electrical isolation between lasers 660. Similarly, slots 682a through 682d are dispersed along laser array 620 to provide thermal isolation between lasers 660.

Conclusion

Active compensation can be used for control of temperature, wavelength, and other characteristics of the lasers within the laser array. Through active compensation, operating performance and manufacturer yields can be improved. The improvements can be obtained with minimal increase in costs for the compensation circuit.

The invention has been described for a laser array having multiple lasers. The invention can also be applied to a single laser to maintain its operating temperature, or other operating characteristics, at specified settings.

The invention can also be used to construct a selectable and switchable laser array. Conventionally, the wavelength of a laser is changed after the temperature is set and allowed to settled, thereby resulting in a relatively slow process. With the reduced thermal and electrical cross-talk design of the invention (as provided by the use of dissipation elements within the laser array), the discrete laser array can be quickly switched from one wavelength to another wavelength. The invention thus provides faster switching between wavelengths than the conventional design.

The foregoing description of specific embodiments is provided to enable any person skilled in the art to make or use the present invention. The various modifications to these embodiments will be readily apparent to those skilled in the art, and the generic principles defined herein may be applied to other embodiments without the use of the inventive faculty. For example, the dissipation elements can be placed in other configurations within the laser array than that shown in FIG. 1B. Furthermore, two or more dissipation elements can be placed between lasers to provide additional control. Thus, the present invention is not intended to be limited to the embodiments shown herein but is to be accorded the widest scope consistent with the principles and novel features disclosed herein, and as defined by the following claims.

What is claimed is:

1. A laser transmitter comprising:
   a laser array including
      a plurality of lasers fabricated on a semiconductor substrate, and
      a plurality of dissipation elements disposed within the laser array, at least one of the dissipation elements having independent control; and
   a compensation circuit coupled to the laser array, the compensation circuit including
      a table to store compensation values, and
   drive circuits coupled to the table to receive the compensation values and generate drive signals for the dissipation elements.

2. The laser transmitter of claim 1 as used in a wavelength division multiplexing (WDM) communications system.

3. The laser transmitter of claim 1 wherein the lasers are capable of being selected or deselected.

4. The laser transmitter of claim 1 wherein the dissipation elements are non-lasing diodes.

5. A method for maintaining an operating characteristic of lasers within a laser array comprising:
   determining an operating state of each laser in the laser array;
   selecting compensation values from a table corresponding to the determined operating state of the laser array;

generating drive signals in accordance with the compensation values; and providing the drive signals to selective ones of dissipation elements within the laser array.

6. The method of claim 5 wherein the operating state of each laser includes a selected state and a deselected state.

7. The method of claim 6 wherein the drive signals maintain laser junction temperatures of selected lasers.

8. The method of claim 6 wherein the drive signals maintain operating wavelengths of selected lasers.

9. The method of claim 6 wherein the drive signals maintain operating wavelengths of selected lasers.

10. The method of claim 6 wherein the drive signals reduce changes in wavelength of selected lasers due to changes in temperature.

11. The method of claim 6, as used to improve a wavelength related yield of the laser array.

12. The method of claim 6, as used to reduce thermal crosstalk to a predetermined level.

13. The method of claim 5 as used in a wavelength division multiplexing (WDM) communications system.

14. The method of claim 5 further comprising:
    determining operating wavelengths of the lasers under normal operating conditions;
    computing wavelength errors based on the determined operating wavelengths and specified wavelengths; and
    determining adjusted compensation values that reduce the wavelength errors;
    wherein the generating drive signals is performed in accordance with the adjusted compensation values.

15. The method of claim 14 wherein the wavelength determining, error computing, and adjusted compensation value determining are performed periodically.

16. A method for adjusting operating wavelengths of lasers within a laser array comprising:
    determining the operating wavelengths of the lasers under initial operating conditions;
    computing wavelength errors based on the determined operating wavelengths and specified wavelengths;
    determining temperture-to-wavelength coefficients of the lasers;
    determining thermal coupling coefficients of the dissipation elements to the lasers;
    calculating compensation values that reduce the wavelength errors based on the wavelength errors, the temperature-to-wavelength coefficients, and the thermal coupling coefficients;
    generating drive signals in accordance with the compensation values; and
    providing the drive signals to selective ones of dissipation elements within the laser array.

17. The method of claim 16 wherein the wavelength determining comprises:
    measuring the operating wavelengths of the lasers.

* * * * *